(12) United States Patent
Sanfilippo

(10) Patent No.: US 6,541,318 B2
(45) Date of Patent: Apr. 1, 2003

(54) MANUFACTURING PROCESS OF A HIGH INTEGRATION DENSITY POWER MOS DEVICE

(75) Inventor: Delfo Nunziato Sanfilippo, Cantania (IT)

(73) Assignee: STMicroelectronics, S.R.L., Agrate Brianza (IT)

( * ) Notice: Subject to any disclaimer, the term of this patent is extended or adjusted under 35 U.S.C. 154(b) by 0 days.

(21) Appl. No.: 09/457,070

(22) Filed: Dec. 7, 1999

(65) Prior Publication Data

US 2001/0044176 A1 Nov. 22, 2001

(30) Foreign Application Priority Data

Dec. 9, 1998 (EP) ............................................. 98830738

(51) Int. Cl.⁷ ............................................. H01L 21/338
(52) U.S. Cl. ..................... 438/167; 438/197; 438/222
(58) Field of Search ................................. 438/225, 222, 438/231, 226, 228, 217, 211, 208, 197, 163, 162, 167, 159, 154

(56) References Cited

U.S. PATENT DOCUMENTS

| 4,599,789 A | * | 7/1986 | Gasner ........................ 29/571 |
| 4,710,265 A | * | 12/1987 | Hotta ........................... 437/27 |
| 5,212,100 A | * | 5/1993 | Groves et al. ................ 437/17 |
| 5,723,376 A | | 3/1998 | Takeuchi et al. ............ 438/270 |
| 5,827,764 A | * | 10/1998 | Liaw et al. .................. 438/238 |
| 5,915,180 A | * | 6/1999 | Hara et al. .................. 438/270 |
| 5,958,505 A | * | 9/1999 | Mantl .......................... 427/96 |

FOREIGN PATENT DOCUMENTS

| DE | A-44 15 412 | 5/1994 | ......... H01L/21/336 |
| WO | WO-A-98/04004 | 1/1998 | ........... H01L/29/76 |

OTHER PUBLICATIONS

European Search Report from European Patent Application 98830738.5, filed Dec. 9, 1998.
Patent Abstracts of Japan, vol. 017, No. 006 (E–1302), Jan. 7, 1993 & JP–A–04 239778 (Fuji Electric Co. Ltd.).
Patent Abstracts of Japan, vol. 005, No. 167 (E–079), Oct. 24, 1981 & JP–A–56 096865 (Fujitsu Ltd.).
Patent Abstracts of Japan, vol. 009, No. 075 (E–306, Apr. 4, 1985 & JP–A–59 211276 (Toshiba KK).

* cited by examiner

*Primary Examiner*—Matthew Smith
*Assistant Examiner*—Renzo N. Rocchegiani

(57) ABSTRACT

Process of manufacturing a semiconductor device comprising a step of forming recessed zones in a semiconductor layer of a first conductivity type, a step of oxidation for forming a gate oxide layer at the sidewalls of the recessed zones, a step of forming a polysilicon gate electrode inside the recessed zones, a step of forming body regions of a second conductivity type in the semiconductor layer between the recessed zones, and a step of forming source regions of the first conductivity type in the body regions. The step of forming recessed zones comprises a step of local oxidation of the surface of the semiconductor layer wherein the recessed zones will be formed, with an oxide growth at the semiconductor layer's cost in order to obtain thick oxide regions penetrating in the semiconductor layer, and a step of etching wherein the oxide of the thick oxide regions is removed.

28 Claims, 4 Drawing Sheets

MANUFACTURING PROCESS OF A HIGH INTEGRATION DENSITY POWER MOS DEVICE

BACKGROUND OF THE INVENTION

1. Field of the Invention

The present invention relates to a manufacturing process of a high integration density power MOS device. Particularly, the invention relates to a manufacturing process of a low voltage power MOS device, with a perfect level surface and plain junctions.

2. Discussion of the Related Art

A known class of low voltage power MOS devices is constituted by devices obtained in EHD (Extremely High Density) technology of the type described, for example, in the European patent application EP 0772242 in the name of the same applicant. Referring to FIG. 1, a cross-section view of an EHD power MOS device is shown. A N+ type semiconductor substrate 1 and a N− type semiconductor layer 2 epitaxially grown over the N+ substrate 1 constitute the MOS device drain.

Inside the drain region, particularly in the N− layer 2, diffused P type regions 3 are obtained which constitute the device body regions. In the body regions 3 there are N+ regions 5 which form the device source. Also the source regions 5 are diffused regions.

Over the upper surface of the device there are gate electrodes formed by a thin gate oxide layer 8, a polysilicon layer 9 superimposed on the gate oxide layer 8, and finally an insulating dielectric layer 10 located over the polysilicon layer 9. At the sidewalls of the gate electrodes there are oxide spacers 12 for electrically insulating the gate.

As a consequence of a thermal process, the body regions 3 diffuse under the gate electrode, and in this areas, indicated with 4 in FIG. 1, a channel will form due to the MOS effect in the N− semiconductor layer 2 between the source regions 5 and the drain region, indicated with 6.

The source regions 5 and the body regions 3 are formed in aligned way to the polysilicon regions 9 which form the gate electrode. On the outer part of the device and obtained in the semiconductor layer 2, there are diffused P type regions 7 which have the function to electrically connect all the body regions 3 that are on the device boundary.

Moreover, the device includes a metal layer 11 over the upper surface, suitable to connect the source regions 5 and the body regions 3, and a metal layer 13 on the lower surface of the N+ semiconductor substrate 1, for the drain electrode connection. FIG. 1 shows also a field oxide region 14 which delimits the device active area.

For obtaining such a structure, a process providing at least six photolithographic steps is necessary.

Moreover, the conduction resistance Ron of the device has a non negligible component due to the JFET effect ($R_{JFET}$), because there are body regions 3 placed in front of each other that form depletion regions which reduce the drain regions 6, increasing their resistance.

Other MOS structures exist having recessed gate with a variously shaped trench on the epitaxial layer. These structures are obtained over a semiconductor substrate using a non isotropic etching of the substrate itself for forming the trenches with a proper slope. Over each one of the two sides of the resulting trench, a conductive channel will form.

In view of the state of the art described, it is an object of the present invention to provide a process of manufacturing a high integration density power MOS device with reduced conduction resistance Ron.

SUMMARY OF THE INVENTION

According to the present invention, these and other objects are achieved by a process of manufacturing a semiconductor device comprising a step of forming recessed zones in a semiconductor layer of a first conductivity type, a step of oxidation for forming a gate oxide layer at the sidewalls of said recessed zones, a step of forming a polysilicon gate electrode inside said recessed zones, a step of forming body regions of a second conductivity type in said semiconductor layer between said recessed zones, and a step of forming source regions of the first conductivity type in said body regions, wherein said step of forming recessed zones comprises a step of local oxidation (LOCOS) of the surface of said semiconductor layer wherein said recessed zones will be formed, with an oxide growth on and into said semiconductor layer in order to obtain thick oxide regions penetrating in said semiconductor layer, and a step of etching wherein the oxide of said thick oxide regions is removed.

BRIEF DESCRIPTION OF THE DRAWINGS

The features and advantages of the present invention will be made more evident by the following detailed description of a particular embodiment thereof, illustrated as non-limiting example in the annexed drawings, wherein.

DETAILED DESCRIPTION

Figure 1:
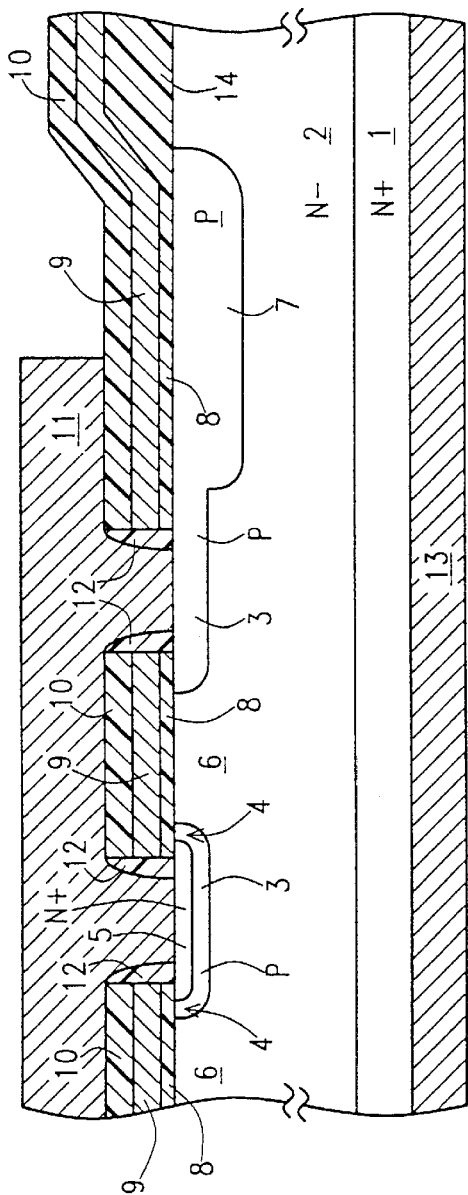
FIG. 1 shows an EHD power MOS device, according to the prior art.
Figure 2:
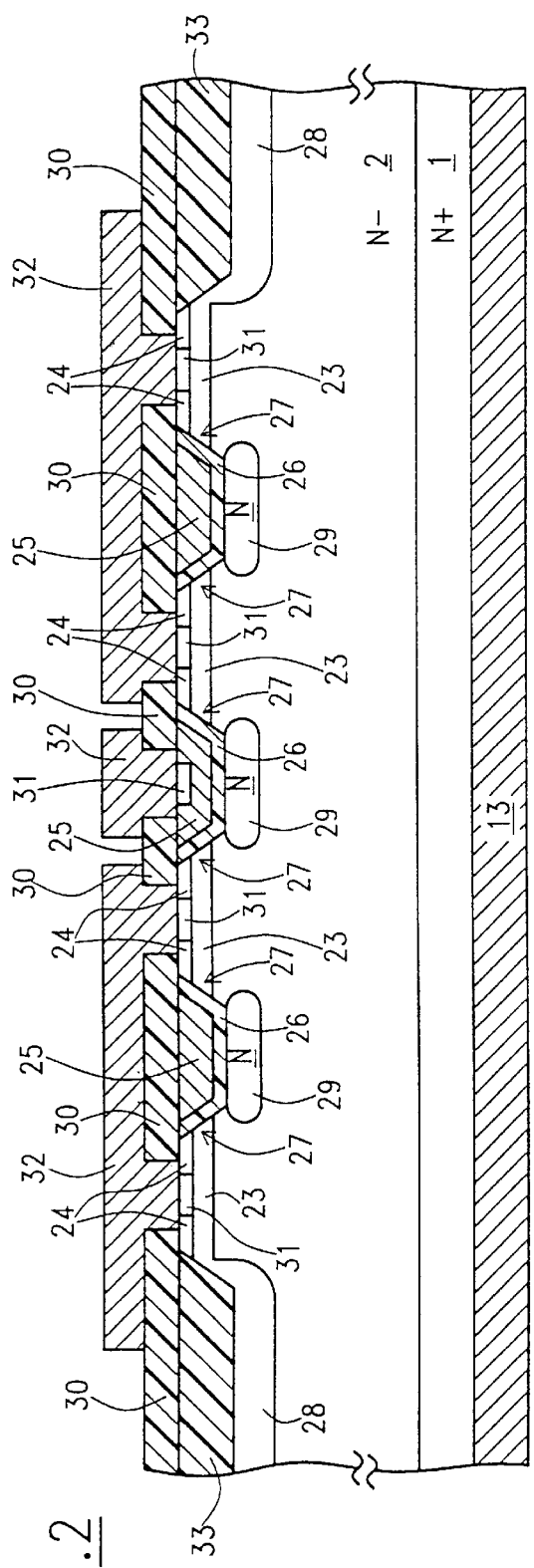
FIG. 2 shows a high integration density power MOS device, according to the present invention.

Referring to FIG. 2, wherein a power MOS device according to the present invention is shown, a N− type semiconductor layer 2 is superimposed, as a consequence of an epitaxial growth, on an N+ type semiconductor substrate 1, in the same way as in FIG. 1. The two semiconductor layers 1 and 2 constitute the drain of the device. On the lower surface of the semiconductor layer 1 there is a metal layer 13 for the electrical connection with the drain electrode.

Diffused P type regions 23 formed in the semiconductor layer 2 constitute the body regions of the device. Inside the body regions 23 diffused N+ type regions 24 are formed, which constitute the source regions of the device.

Between the body regions 23 there are gate regions, each one constituted by a polysilicon region 25 interposed between a lower thin gate oxide layer 26 and an upper insulating dielectric layer 30, which is suitable to insulate the polysilicon layer 25 from possible superimposed metal layers. The source regions 24 and the body regions 23 are delimited by the gate electrode. On the top surface of the device a metal layer 32 is obtained, having a layout suitable to obtain the desired electrical connections.

The conductive channel between the source regions 24 and the drain regions will form in channel regions 27 placed inside the body regions 23, near the gate electrode, and insulated from it the gate oxide 26.

It is possible to form diffused N type regions 29 in the semiconductor layer 2 under the gate electrodes, for obtaining a dopant enrichment of the drain region in order to decrease the device resistance Ron. It is moreover possible to also form diffused P type regions 28 which electrically connect all the body regions that are placed at the device boundary.

In the contact zones between semiconductor and metal, the metal layer 32 accomplishes a short-circuit between the P body regions 23 and the N+ source regions 24.

Between the metal layer 32, which can be formed by more layers, and the semiconductor, and between the metal layer 32 and the polysilicon layer 25 of the gate electrode, regions 31 can be interposed, constituted by a material that reduces the specific contact resistance, typically silicide.

FIG. 2 shows also field oxide regions 33 suitable to delimit the active areas of the device.

In comparison with the device structure according to the prior art, in the present invention the body-drain junction results to be perfectly flat and this allows obtaining with the same thickness and resistivity of the N– drain region 2 and the same doping profile of the P body region 23, an increase of the breakdown voltage BVdss. Moreover, the possible presence of the diffused N type regions 29, named enrichment regions, formed in the N– drain semiconductor layer 2 under the gate electrodes, decreases the conduction resistance component Ron of the device due to the epitaxial resistance ($R_{EPI}$). Furthermore, the resistance component Ron of the device due to the JFET effect ($R_{JFET}$) will be zero because in the present invention there are not P body regions placed in front of each other, as in the prior art.

Figure 3:
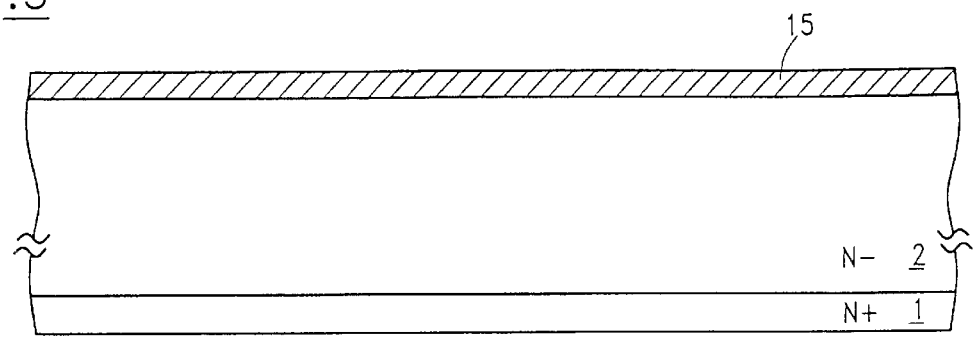
FIGS. 3 to 12 show the main steps of a process of manufacturing a high integration density power MOS device, according to the present invention.

Referring to FIGS. 3 to 12, the main steps of a process of manufacturing a device structure according to the present invention are shown. After an epitaxial growth of a N–type semiconductor layer 2 over a N+ type semiconductor substrate 1, a deposition of a silicon nitride layer 15 is accomplished (FIG. 3).

Figure 4:
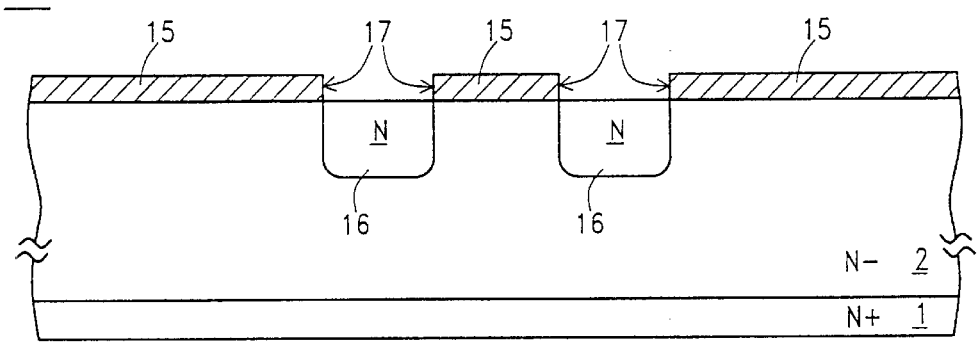

By means of a photolithographic process the nitride layer 15 is etched and removed at the zones where subsequently the gate electrodes will be formed, obtaining windows 17. It can be noted that the photolithography is obtained over a perfect level surface. Then, a ion implantation is performed through the same windows of the previous mask in order to form doped N type regions 16 in the N– layer 2 (FIG. 4). Optionally, it is possible to obtain diffused P– type regions under the above-mentioned doped N regions 16, by means of a proper ion implantation.

Figure 5:
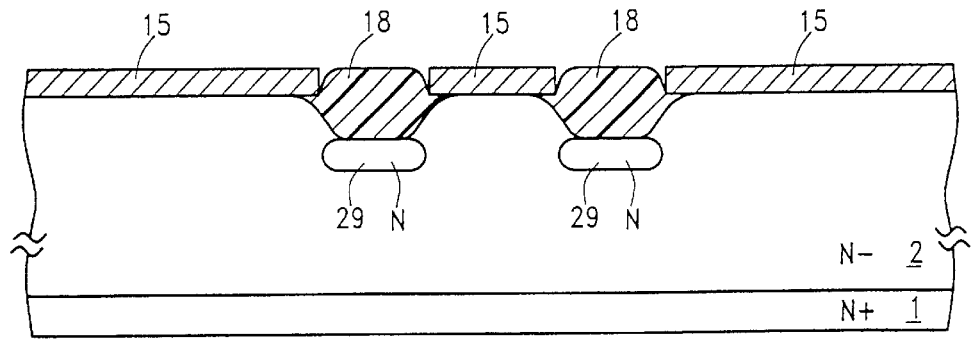

Subsequently, an oxidation process is accomplished on the device, obtaining a silicon oxide growth, at layer 2 silicon's cost, over the surface zones wherein the nitride 15 has been removed (oxide regions 18 in FIG. 5). Under the above-mentioned oxide regions 18 there are enrichment regions 29, resulting from the doped N regions 16.

Figure 6:
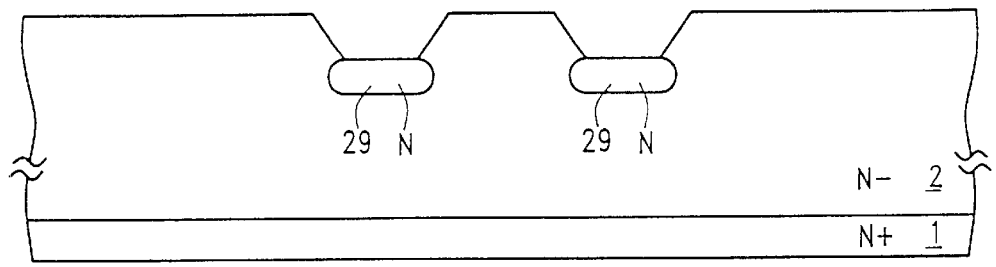

Then, both the grown oxide 18 and the remaining nitride 15 are removed, and the resulting semiconductor surface is characterized by the presence of recessed zones, under which the enrichment regions 29 are disposed (FIG. 6).

Figure 7:
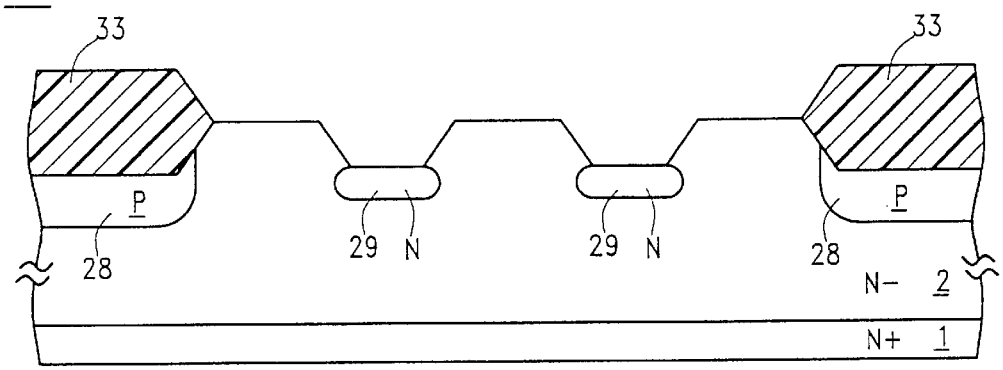

By means of a similar procedure field oxide regions 33 (e.g. LOCOS) are formed, and are suitable to delimit the active areas of the device. Before the oxidation step, it is possible to perform a ion implantation, using the same photolithographic mask, for obtaining P type regions 28, said P-field regions, located under the field oxide regions 33 (FIG. 7). In the subsequent figures said P-field regions 28 are not shown in order to simplify the figures.

Figure 8:
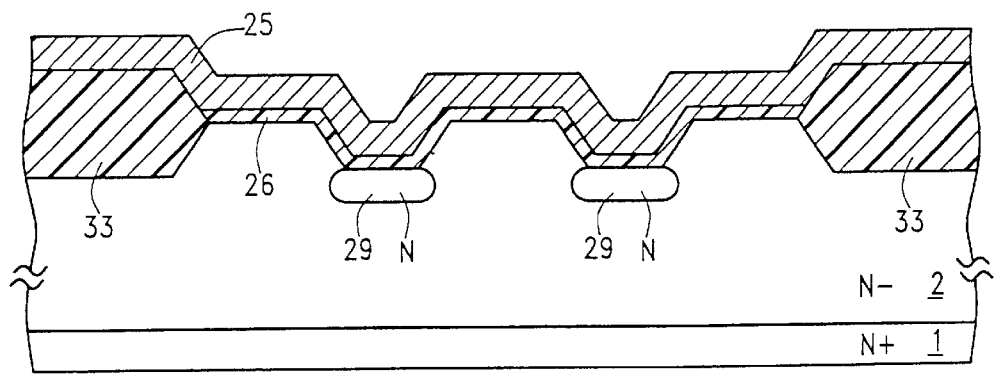

Subsequently, an oxidation is performed for forming the gate oxide layer 26, and such an oxidation is set in a proper way in order to obtain a suitable gate oxide that has the electrical performance required by the device. It follows a deposition of a doped polysilicon layer 25, or doped in consequence of a ion implantation (FIG. 8).

Figure 9:
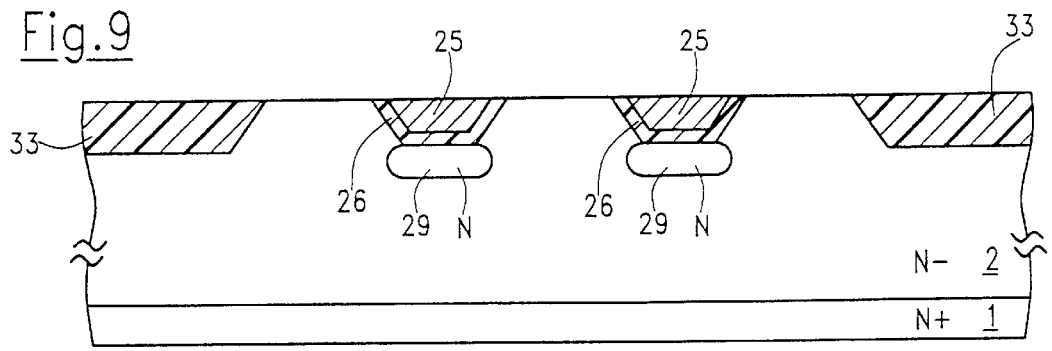
Figure 10:
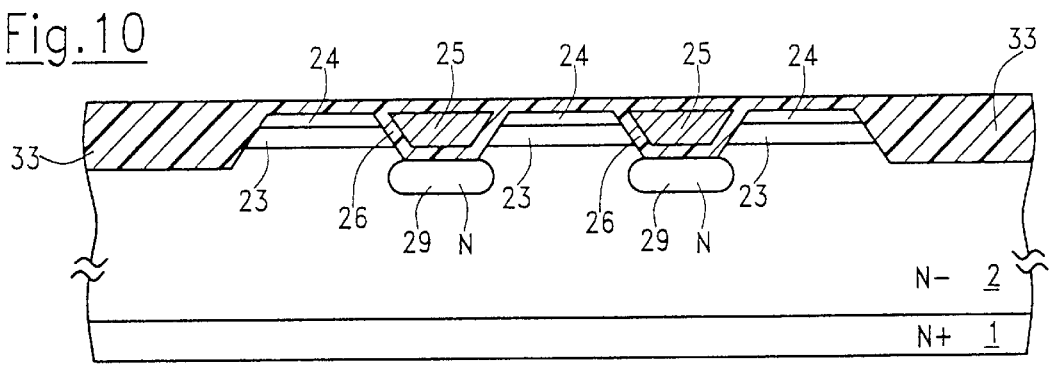

At this point a level surface process is performed (FIG. 9). Then, two dopant ion implantations are performed for obtaining the P type body regions 23 and the N+ type source regions 24 inside them. It follows a thermal diffusion process of the above-mentioned body regions 23 and source regions 24 (FIG. 10).

Figure 11:
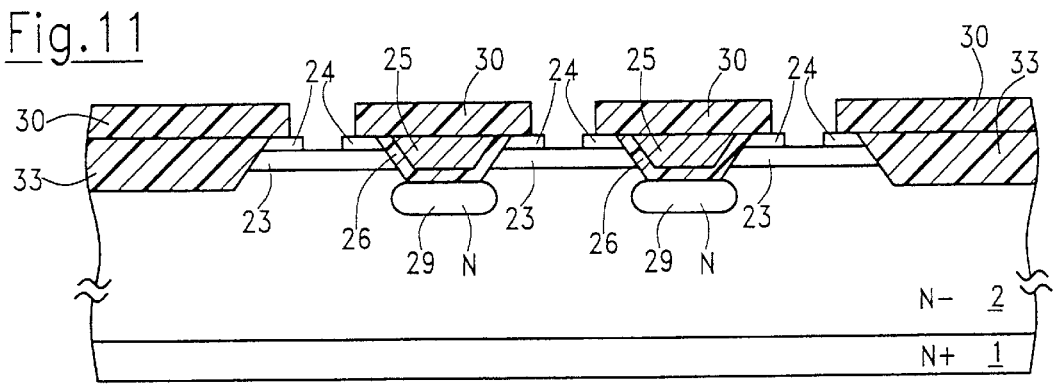

Subsequently, one or more insulating dielectric layers 30 are deposited (e.g. VAPOX) for obtaining the electrical insulation between the polysilicon 25 and the superimposing metal layer which will be formed next. By means of photolithographic techniques, windows are opened in the dielectric layer 30 for obtaining the contact regions on both the semiconductor (body-source short-circuit zones) and the polysilicon (contact zones on the gate electrode). It can be noted that the photolithography is performed over a perfect level surface. The opening of the contacts provides for removing a portion of the surface zone of the N+ doped semiconductor in order to allow to perform the above-mentioned short-circuit between body and source (FIG. 11).

Before performing the metallization, that can require one or more metal layers, it is possible to perform a sintering process for forming silicide (e.g. PtSi) for reducing the specific contact resistance. In this way silicide regions 31 comprised between the source regions 24 are obtained.

Figure 12:
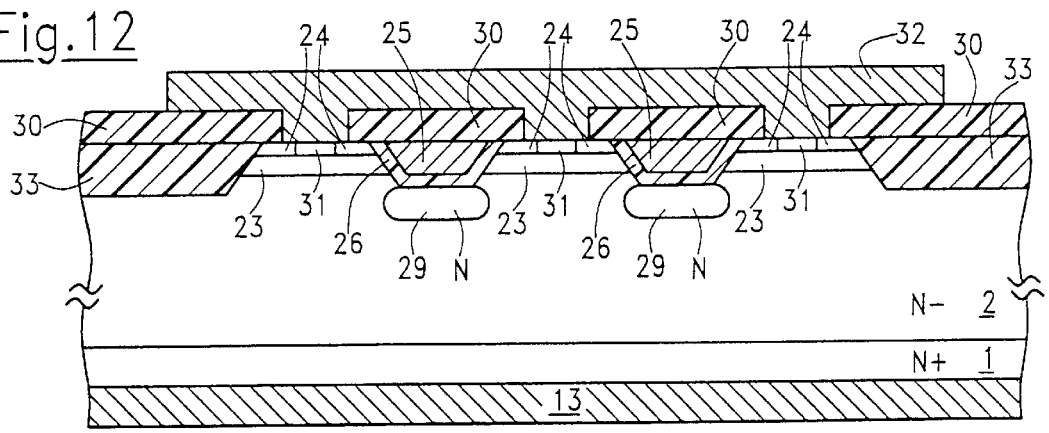

Finally, lower metal layers 13 and upper metal layers 32 with a proper layout are accomplished in order to obtain the desired electrical connections of the device (FIG. 12).

For manufacturing such a structure only four photolithographic processes are required in comparison with the six required by the example according to the prior art. The manufacturing process is easier, the working times are reduced and so the process results to be less expensive.

Moreover, working over a perfect level surface is an ideal condition for processes comprising photolithographic techniques, because it allows obtaining the minimum resolution allowed by the machinery for manufacturing the structure. Particularly, such an advantage results to be mainly evident during the accomplishment of the regions on which the polysilicon of the gate electrode is placed, and for the opening of the contacts.

The possibility of working with the minimum resolution together with the elimination of the JFET effect allows a great increase of the device integration density, because it is possible to move two contiguous channel zones closer together as compared to the prior art example. In conclusion, the reduction of the conduction resistance Ron and the increased integration density allow to increase the current flow of the devices with the same overall area.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. Process of manufacturing a semiconductor device comprising a step of forming recessed zones in a semiconductor layer of a first conductivity type, a step of oxidation for forming a gate oxide layer at the sidewalls of said recessed zones, a step of forming a polysilicon gate electrode inside said recessed zones, a step of forming body regions of a second conductivity type in said semiconductor layer between said recessed zones, and a step of forming source regions of the first conductivity type in said body regions, wherein said step of forming recessed zones comprises a step of local oxidation of the surface of said semiconductor layer wherein said recessed zones will be formed, with an oxide growth on and into said semiconductor layer in order to obtain thick oxide regions penetrating in said semiconductor layer, and a step of etching wherein the oxide of said thick oxide regions is removed;

wherein said step of forming recessed zones comprises a step of forming a nitride layer over the upper surface of said semiconductor layer, a step of forming openings in said nitride layer, and finally a step of removing said nitride layer after said step of etching said thick oxide regions;

wherein said step of forming recessed zones comprises a step of introducing dopant of the first conductivity type through said openings in order to form first doped regions, before said step of local oxidation;

wherein under said recessed zones formed by removing said thick oxide regions there are enrichment regions of the first conductivity type, derived from said step of introducing dopant of the first conductivity type, previous to said step of oxidation for forming said thick oxide regions.

2. Process according to claim 1, wherein said step of forming said gate electrode comprises a step of depositing a polysilicon layer, a step of planarization of the upper surface of said device so that said gate oxide and said polysilicon layer are present only in said recessed zones previously formed.

3. Process according to claim 1, wherein said step of forming said body regions and said source regions comprises a first ion implantation of dopant of a second conductivity type which forms said body regions between said recessed zones, and a second ion implantation of dopant of the first conductivity type which forms said source regions in said body regions.

4. Process according to claim 1, comprising a first beginning step of epitaxially growing said semiconductor layer over a hardly doped substrate of the first conductivity type.

5. Process according to claim 1, further comprising a step of introducing dopant of the second conductivity type through said openings in order to form second doped regions of the second conductivity type under said first doped regions, before said step of local oxidation.

6. Process according to claim 1, further comprising a step of forming field oxide regions which delimit the active areas of the device, after the formation of said recessed zones.

7. Process according to claim 6, further comprising a step of ion implantation of dopant of the second conductivity type before said step of forming said field oxide regions, in order to form third doped regions of the second conductivity type under said field oxide regions.

8. Process according to claim 1, further comprising a step of forming at least one insulating dielectric layer with proper layout over the upper surface of the device, after the step of forming said body regions and said source regions, for electrically insulating said polysilicon layer.

9. Process according to claim 8, further comprising a step of forming at least one metal layer with proper layout, after the step of forming said at least one insulating dielectric layer, for obtaining the desired electrical connections of the device.

10. Process according to claim 9, further comprising a step of forming openings in said source regions, a step of forming contact regions in said openings of said source regions in order to obtain an electrical connection between said source regions and said body regions, said contact regions being electrically connected with said at least one metal layer.

11. Process according to claim 10, wherein said contact regions are constituted by silicide.

12. Process according to claim 1, further comprising a step of forming a metal layer on the bottom surface of said semiconductor substrate, in order to obtain a drain contact.

13. Process according to claim 1, wherein said first conductivity type is the N type and said second conductivity type is the P type.

14. Process according to claim 1, wherein said first conductivity type is the P type and said second conductivity type is the N type.

15. A process of manufacturing a semiconductor device comprising steps of:

forming recessed zones in a semiconductor layer of a first conductivity type, including a step of local oxidation of a surface of the semiconductor layer wherein the recessed zones will be formed, with an oxide growth on and into the semiconductor layer in order to obtain thick oxide regions penetrating in the semiconductor layer, and a step of etching wherein the oxide of the thick oxide regions is removed;

forming a gate oxide layer at the sidewalls of the recessed zones by oxidation;

forming a polysilicon gate electrode inside the recessed zones;

forming body regions of a second conductivity type in the semiconductor layer between the recessed zones; and forming source regions of the first conductivity type in the body regions;

wherein the step of forming recessed zones further comprises a step of forming a nitride layer over the upper surface of the semiconductor layer, a step of forming openings in the nitride layer, and finally a step of removing the nitride layer after the step of etching the thick oxide regions; and wherein the step of forming recessed zones comprises a step of introducing dopant of the first conductivity type through the openings in order to form first doped regions, before the step of local oxidation, thereby forming enrichment regions that decrease a resistance $R_{on}$ of the device.

16. Process according to claim 15, wherein the step of forming the gate electrode comprises a step of depositing a polysilicon layer, a step of planarization of an upper surface of the device so that the gate oxide and the polysilicon layer are present only in the recessed zones previously formed.

17. Process according to claim 16, further comprising a step of forming at least one insulating dielectric layer over an upper surface of the device, after the step of forming the body regions and the source regions, for electrically insulating the polysilicon layer.

18. Process according to claim 15, wherein the step of forming the body regions and the source regions comprises a first ion implantation of dopant of a second conductivity type which forms the body regions between the recessed zones, and a second ion implantation of dopant of the first conductivity type which forms the source regions in the body regions.

19. Process according to claim 15, further comprising a step of introducing dopant of the second conductivity type through the openings in order to form second doped regions of the second conductivity type under the first doped regions, before the step of local oxidation.

20. Process according to claim 15, further comprising a step of forming a metal layer on a bottom surface of the semiconductor layer, in order to obtain a drain contact.

21. A process of manufacturing a semiconductor device comprising steps of:

forming a nitride layer over an upper surface of a semiconductor layer of a first conductivity type;

forming openings in the nitride layer;

introducing dopant of the first conductivity type through the openings in order to form enrichment regions in the semiconductor layer;

forming recessed zones in the semiconductor layer above the enrichment regions, including a step of local oxidation of the surface of the semiconductor layer wherein the recessed zones will be formed, with an oxide growth on and into the semiconductor layer in order to obtain oxide regions penetrating in the semiconductor layer, and a step of etching wherein the oxide of the oxide regions is removed;

removing the nitride layer after the step of etching the oxide regions;

forming a gate oxide layer at the sidewalls of the recessed zones by oxidation;

forming a polysilicon gate electrode inside the recessed zones;

forming body regions of the second conductivity type in the semiconductor layer between the recessed zones; and forming source regions of the first conductivity type in the body regions.

22. Process according to claim 21, wherein the step of forming the gate electrode comprises a step of depositing a polysilicon layer, a step of planarization of an upper surface of the device so that the gate oxide and the polysilicon layer are present only in the recessed zones previously formed.

23. Process according to claim 22, further comprising a step of forming at least one insulating dielectric layer over the upper surface of the device, after the step of forming the body regions and the source regions, for electrically insulating the polysilicon layer.

24. Process according to claim 23, further comprising a step of forming at least one metal layer, after the step of forming the at least one insulating dielectric layer, for obtaining desired electrical connections of the device.

25. Process according to claim 24, further comprising a step of forming openings in the source regions, a step of forming contact regions in the openings of the source regions in order to obtain an electrical connection between the source regions and the body regions, the contact regions being electrically connected with the at least one metal layer.

26. Process according to claim 21, wherein the step of forming the body regions and the source regions comprises a first ion implantation of dopant of a second conductivity type which forms the body regions between the recessed zones, and a second ion implantation of dopant of the first conductivity type which forms the source regions in the body regions.

27. Process according to claim 21, further comprising a step of forming a metal layer on a bottom surface of the semiconductor substrate, in order to obtain a drain contact.

28. Process according to claim 21, further comprising a step of forming diffused regions of a second conductivity type between the enrichment regions by ion implantation.

* * * * *